United States Patent
Park

(10) Patent No.: US 6,362,661 B1
(45) Date of Patent: Mar. 26, 2002

(54) SENSE AMPLIFIER FOR USE IN A SEMICONDUCTOR MEMORY DEVICE

(75) Inventor: Jung-Hoon Park, Ahnyang-shi (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/591,809

(22) Filed: Jun. 12, 2000

(30) Foreign Application Priority Data

Jun. 10, 1999 (KR) .............................................. 99-21528

(51) Int. Cl.[7] ................................................. G11C 7/06
(52) U.S. Cl. .......................................... 327/53; 327/52
(58) Field of Search ...................... 327/51–57; 365/205, 365/203, 189.05, 189.09, 233.5

(56) References Cited

U.S. PATENT DOCUMENTS

| | | | | |
|---|---|---|---|---|
| 5,148,063 A | * | 9/1992 | Hotta | ............................ 327/56 |
| 5,162,680 A | * | 11/1992 | Norman et al. | ................ 327/51 |
| 5,771,197 A | * | 6/1998 | Kim | ............................ 365/210 |
| 5,856,748 A | * | 1/1999 | Seo et al. | ...................... 327/53 |
| 6,087,859 A | * | 7/2000 | Lee et al. | ...................... 327/52 |

* cited by examiner

*Primary Examiner*—Toan Tran
(74) *Attorney, Agent, or Firm*—Marger Johnson & McCollom, P.C.

(57) ABSTRACT

Disclosed herein is a sense amplifier for use in a semiconductor memory device. The sense amplifier of the present invention is comprised of a reference voltage generator, a sense voltage generator, and an inverter. The reference voltage generator produces a reference voltage at a reference node, and the sense voltage generator produces a sense voltage at a sense node in response to an on or off state of a memory cell. In addition, the inverter is coupled to the sense node, for detecting whether the sense voltage is higher than a predetermined trip voltage of the inverter, and for outputting a logic low or high signal representation of the on or off state of the memory cell. The sense amplifier of the present invention secures a stable, speedy sensing operation despite increases in degree of integration and decreases in power supply voltages, thereby to increase the operational speed of the device.

37 Claims, 4 Drawing Sheets

SENSE AMPLIFIER FOR USE IN A SEMICONDUCTOR MEMORY DEVICE

FIELD OF THE INVENTION

The present invention relates to semiconductor integrated circuit devices, and more particularly to a sense amplifier for use in a semiconductor memory device.

BACKGROUND OF THE INVENTION

To increase the integration degree of semiconductor memory devices, the size of individual memory cells must be decreased. Such a reduction in memory cell size inevitably results in a reduction in memory cell current. For semiconductor memory devices intended for use in portable electronic equipment which operates at low voltages, the memory cell current required for sensing data is reduced even further because the devices operate at very low voltages.

However, when the current through a semiconductor memory cell is decreased, the speed of a sense amplifier which is used to sense the state of the memory cell decreases in proportion to the decrease in the memory cell current. As a result, the operating speed of the semiconductor memory device is reduced.

Generally, a conventional sense amplifier has been implemented using a differential amplifier, which senses and amplifies a voltage difference between two input signals. The differential amplifier includes two input transistors, a current sinker (composed of a MOS transistor) coupled in series with input transistors, and a current mirror. To a first input transistor, a sense voltage is provided as an input signal. The sense voltage is determined by a cell current flowing through the memory cell. To the other input transistor, a reference voltage is provided as the other input signal. The reference voltage is determined by a reference current, which is typically generated by a reference cell.

When the differential amplifier is used as a sense amplifier, although a difference between the reference and sense voltages exists, the input transistor is turned on when its input voltage (the sense or reference voltage) is higher than its threshold voltage. That is, although a difference between the reference and sense voltages exists, the input transistors continue to be turned off utile the input voltage of the input transistor is higher than its threshold voltage. Furthermore, the threshold voltage of the respective input transistors is increased because the input transistors are coupled in series to the current sinker. Also, the speed of the conventional sense amplifier can be increased by increasing the difference between the reference voltage and the sense voltage.

According to the above-described condition, however, there is operational delay until a sufficient voltage difference develops in the sense amplifier. Thus, it is difficult to achieve a stable, but speedy operation of the conventional sense amplifier. This delay hampers prior art sense amplifiers because of a decrease in sensing speed thereof. Furthermore, as the integration degree is increased (causing an increment of a bit line loading) and the power supply voltage is lowered, such a problem becomes more serious.

SUMMARY OF THE INVENTION

It is, therefore, an object of the present invention to provide a sense amplifier for use in a semiconductor memory device capable of securing a stable, speedy sensing operation despite increases in degree of integration and decreases in power supply voltages, thereby to increase the operational speed of the device.

In order to attain the above objects, according to an aspect of the present invention, a novel sense amplifier is provided for use in a semiconductor memory device. The sense amplifier comprises a reference voltage generator, a sense voltage generator, and an inverter. The reference voltage generator produces a reference voltage at a reference node, and the sense voltage generator produces a sense voltage at a sense node in response to the state of a memory cell. The inverter is coupled to the sense node, and when the sense voltage is higher than a predetermined trip voltage of the inverter, the inverter outputs a logic low or high signal.

BRIEF DESCRIPTION OF THE DRAWINGS

The present invention will be described by way of exemplary embodiments, but not limitations, illustrated in the accompanying drawings in which like references denote similar elements, and in which.

DESCRIPTION OF THE PREFERRED EMBODIMENT

A preferred embodiment of the present invention will be more fully described with reference to the accompanying drawings.

Figure 1:
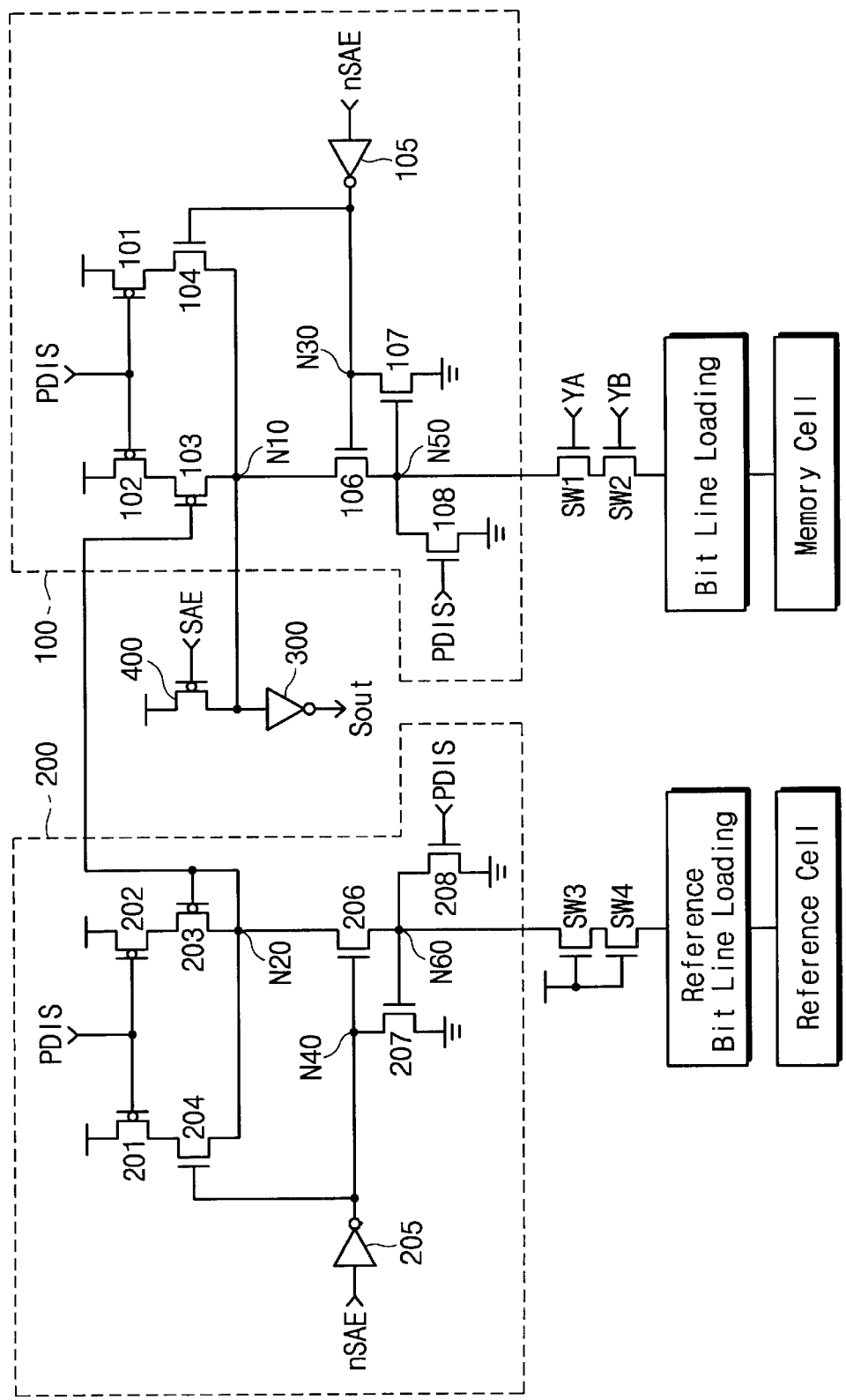
FIG. 1 is a preferred embodiment of a sense amplifier according to the present invention.

FIG. 1 is a preferred embodiment of a sense amplifier according to the present invention. The sense amplifier of the present invention comprises a sense voltage generator 100 for generating a sense voltage at a sense node N10 in response to the state of a memory cell, a reference voltage generator 200 for generating a reference voltage at a reference node N20, an inverter 300 used as a level detector and coupled to the sense node N10, and a PMOS transistor 400 coupled to a power supply voltage and the sense node N10. PMOS transistor 400 is turned on/off in accordance with a sense amplifier enable signal SAE. In this embodiment, the sense voltage generator 100 is coupled to the reference node N20 of the reference voltage generator 200 so as to receive the reference voltage during a sensing operation. The memory cell preferably may be a mask read-only memory cell, or a flash memory cell, but the memory cell alternatively may be one selected from an other type of nonvolatile memory cells and volatile memory cells.

The sense voltage generator 100 is comprised of three PMOS transistors 101, 102 and 103, four NMOS transistors 104, 106, 107 and 108, and one inverter 105. The PMOS transistor 101 has its source coupled to the power supply voltage with its gate receiving a discharge signal PDIS. The PMOS transistor 102, the gate of which is coupled to the gate of the transistor 101 to receive the discharge signal PDIS, has its source connected to the power supply voltage. A drain of the PMOS transistor 103 and a source of the NMOS transistor 104 are coupled in common to the sense node N10. A gate of the transistor 103 is coupled to the reference node N20 so as to receive the reference voltage. A gate of the transistor 104 is coupled to a bias node N30, that is, an output terminal of the inverter 105 which inverts a signal nSAE complementary to the sense amplifier enable signal SAE. A current path of the NMOS transistor 106, the gate of which is coupled to the node N30, is formed between the sense node N10 and a node N50. The NMOS transistor 107 has its current path formed between the gate of the transistor 106 (or the bias node N30) and a ground, with the gate of NMOS transistor 107 coupled to the node N50. A current path of the NMOS transistor 108 is formed between the node N50 and the ground, with the gate of NMOS transistor 108 coupled to receive the discharge signal PDIS.

In this embodiment, the transistors 101, 102, 103 and 104 constitute a current source, and the inverter 105 and the transistor 107 constitute a bias circuit. The transistor 108 serves as a discharge transistor. In FIG. 1, a Reference Bit Line Loading (indicating a reference bit line) corresponds to a Bit Line Loading (a bit line), and the transistors SW3 and SW4 correspond to the transistors SW1 and SW2, respectively.

The reference voltage generator 200 mirrors configuration that of the sense voltage generator 100. Specifically, the reference voltage generator 200 comprises PMOS transistors 201, 202, 203 which correspond to the PMOS transistors 101, 102, 103, respectively; NMOS transistors 204, 206, 207 and 208 which correspond to the NMOS transistors 104, 106, 107 and 108, respectively; an inverter 205 corresponding to the inverter 105; and nodes N20, N40 and N60 which correspond to the nodes N10, N30 and N50, respectively. In FIG. 1, the PMOS transistors 103 and 203 constitute a current mirror.

Figure 2A:
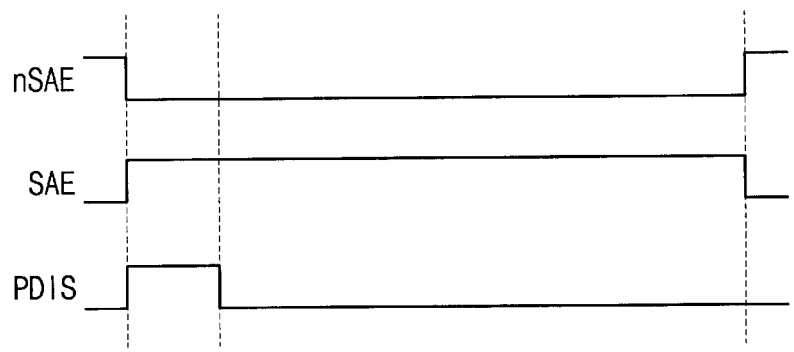
FIG. 2A is a diagram showing a timing between control signals of FIG. 1.
Figure 2B:
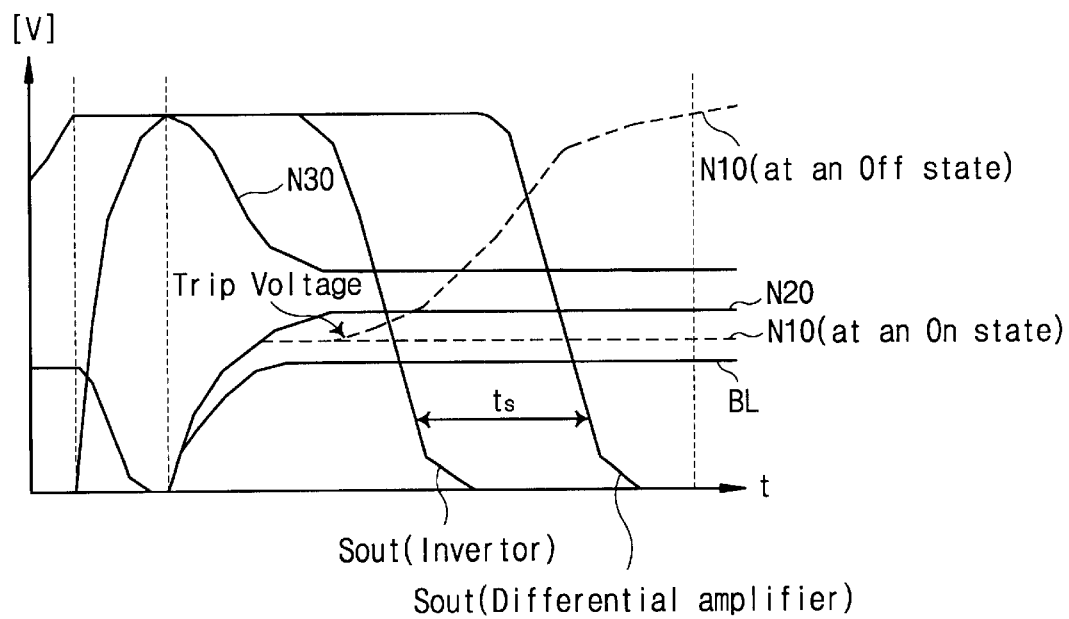
FIG. 2B is a diagram showing waveforms at various nodes of FIG. 1, as compared with slower memory sense waveforms characterizing prior art sense amplifiers.

FIG. 2A is a diagram representing the timing of the control signals of FIG. 1. FIG. 2B is a diagram showing waveforms at various nodes of FIG. 1. The operation of the sense amplifier according to the present invention will be more fully described below with reference to the accompanying drawings.

When the signals SAE and nSAE go high and low, respectively, the NMOS transistors 104, 106, 204 and 206 are turned on. And, when the signal PDIS transitions from a logic low level to a logic high level, the PMOS transistors 101, 102, 103, 201, 202 and 203 are turned off. As a result, no current is supplied to the nodes N10 and N20. At the same time, the transistors 108 and 208 are turned on, thereby discharging the bit line and the reference bit line at a ground voltage, respectively. This turns the transistors 107 and 207 off. As illustrated in FIG. 2B, during the bit line discharge operation, the bias node N30 of the sense voltage generator 100 is charged up to the power supply voltage via the inverter 105. Similarly, the bias node N40 of the reference voltage generator 200 is charged up to the power supply voltage via the inverter 205.

As the discharge signal PDIS transitions from a logic high level to a logic low level, the NMOS transistors 108 and 208 are turned off, and the PMOS transistors 101, 102, 201 and 202 are turned on. This forces the transistors 101 and 104 to charge the nodes N10 and N50 and the bit line, and the transistors 201 and 204 to charge the nodes N20 and N60 and the reference bit line. In accordance with the above described precharge operation, the transistor 107 is turned on when a voltage at the node N50 becomes greater than the threshold voltage of the transistor 107. This decreases the bias voltage at the node N30 from the power supply voltage as illustrated in FIG. 2B. Similarly, as a voltage at the node N60 becomes greater than the threshold voltage of the transistor 207, the bias voltage at the node N40 decreases because the transistor 207 is turned on.

The transistors 106 and 107 comprise a negative feedback circuit, which senses and amplifies a smaller voltage change at the node N50 so as to be reflected as a larger voltage onto the sense node N10. Similarly, the transistors 206 and 207 comprise a negative feedback circuit, which senses and amplifies a smaller voltage change at the node N60 so as to be reflected as a larger voltage onto the reference node N20.

At an initial precharge, the nodes N10 and N20 are precharged via transistors 104 and 204, respectively. However, as the bias voltages at the nodes N30 and N40 are decreased, the gate voltages of the transistors 104 and 204 also decrease. Furthermore, since the voltages at the nodes N10 and N20 are increased, the source voltages of the transistors 104 and 204 also are increased. As a result, the transistors 104 and 204 are shut off. After this, the sense and reference nodes N10 and N20 are precharged via the transistors 103 and 203, respectively, each serving as a load transistor.

As described above, the PMOS transistors 103 and 203 constitute a current mirror. The PMOS transistor 203 may source current by the amount of current flowing via the reference cell. As the precharge operation is performed, a voltage at the reference node N20, i.e., a reference voltage, is maintained constant so long as a current amount supplied by the transistor 203 is identical to a current amount flowing via the reference cell. Although the PMOS transistor 103 sources the same amount of current as the PMOS transistor 203, nevertheless, a voltage at the sense node N10 changes in accordance with the state of the memory cell.

In particular, when the memory cell is on, the voltage at the sense node N10 is maintained lower than the voltage at the reference node N20 because the amount of current supplied via the memory cell is greater than that supplied via the PMOS transistor 103. As a result, since the voltage at the sense node N10 is lower than a predetermined trip voltage of the inverter 300, a signal Sout of a logic high level as a sensing result of the sense amplifier is output from the inverter 300. On the other hand, in the case where the memory cell is off, as compared with a voltage at the node N10 when the memory cell is on, the voltage at the sense node N10 increases gradually because the off memory cell does not discharge any current from the sense node N10. As illustrated in FIG. 2B, as the voltage at the sense node N10 becomes higher than the trip voltage of the inverter 300, the output Sout of the inverter 300 starts to transition from a logic high level to a logic low level though the voltage at the sense node N10 is less than the voltage at the reference node N20.

After this, as the signal SAE transitions from a logic high level to a logic low level, the PMOS transistor 400 is turned on such that the output Sout of the inverter 300 is maintained at a logic low level. That is, sense amplifier has been completed its sensing operation.

As illustrated in FIG. 2B, a sensing time (representing a sensing speed) of the sense amplifier according to the present invention is reduced (is improved) by a time $t_s$ as compared with that of the conventional sense amplifier using a differential amplifier. In the present invention, the output Sout of the sense amplifier changes depending on whether a voltage at the sense node N10 is higher than the trip voltage of the inverter 300. The output Sout changes regardless of the difference between the reference and sense voltages, and even if the voltage at the sense node N10 is lower than the voltage at the reference node N20 (when cell is off). On the other hand, in the case of the conventional sense amplifier using a differential amplifier, the sense amplifier operates when a voltage at the sense node N10 is higher than the voltage at the reference node N20. Therefore, the time for sensing a difference between the sense and reference voltages, i.e., a sensing time, is greater than that of the sense amplifier according to the present invention. Furthermore, increasing the difference between the reference voltage and the sense voltage in an attempt to improve the speed of the conventional sense amplifier increases the sensing time (the sensing speed) of the conventional sense amplifier, lowering its speed.

Figure 3:
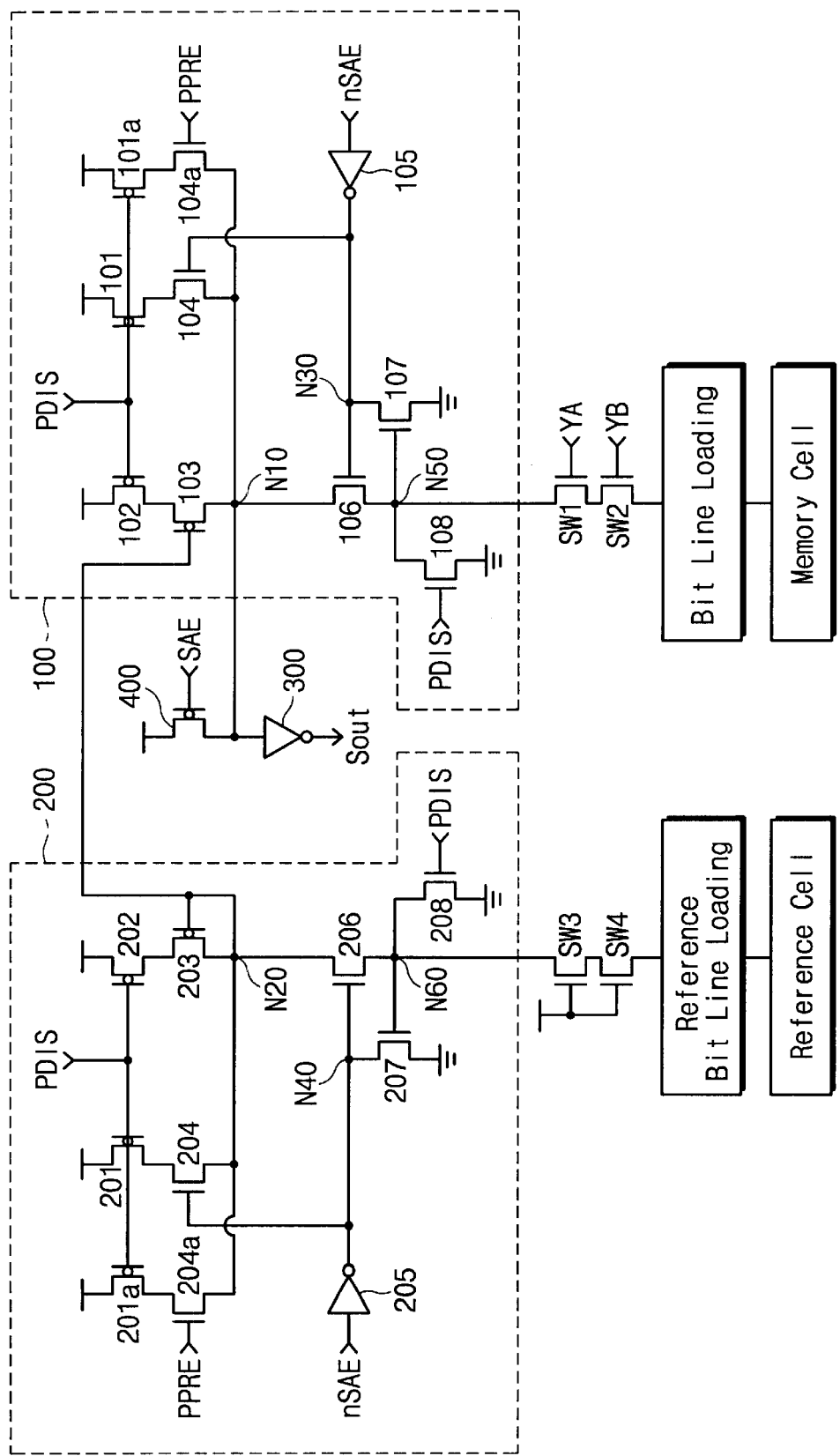
FIG. 3 is a second embodiment of a sense amplifier according to the present invention.

FIG. 3 illustrates a second embodiment of a sense amplifier according to the present invention. Referring to FIG. 3, the sense amplifier has the same arrangement as that of the sense amplifier shown in FIG. 1 except that additional transistors 201a, 204a, 101a and 104a in the current source circuits are provided. The transistors 101a, 104a are connected in serial and coupled between the power supply voltage and the sense node N10. Also, the gates of transistors 101a, 104a are controlled by the PDIS and PPRE signal, respectively. Similarly, the transistors 201a, 204a are connected in serial and coupled between the power supply voltage and the reference node N20. Also, the gates of transistors 201a, 204a are controlled by the PDIS and PPRE signal respectively.

For the sake of simplicity and to avoid duplicated description, only the different feature of the second embodiment related to precharge operation will be explained. The transistors 104a and 204a responding to a precharge control signal PPRE are provided to supply more sufficient charge for precharge operation. By briefly enabling the precharge control signal PPRE with the sense amp enable signal nSAE, large amount of charge can be supplied to the nodes N10 and N20 by the transistors 104a and 204a having larger current driving capabilities. After disabling the precharge control signal PPRE, the transistors 104 and 204 which is controlled by internal bias voltage are used for the stable precharge operation.

As described above, with the briefly enabled precharge transistor controlled by the precharge control signal PPRE and the gradual shut-off of the precharge transistor controlled by the internal bias voltage, precharge operation can be more efficient.

Figure 4:
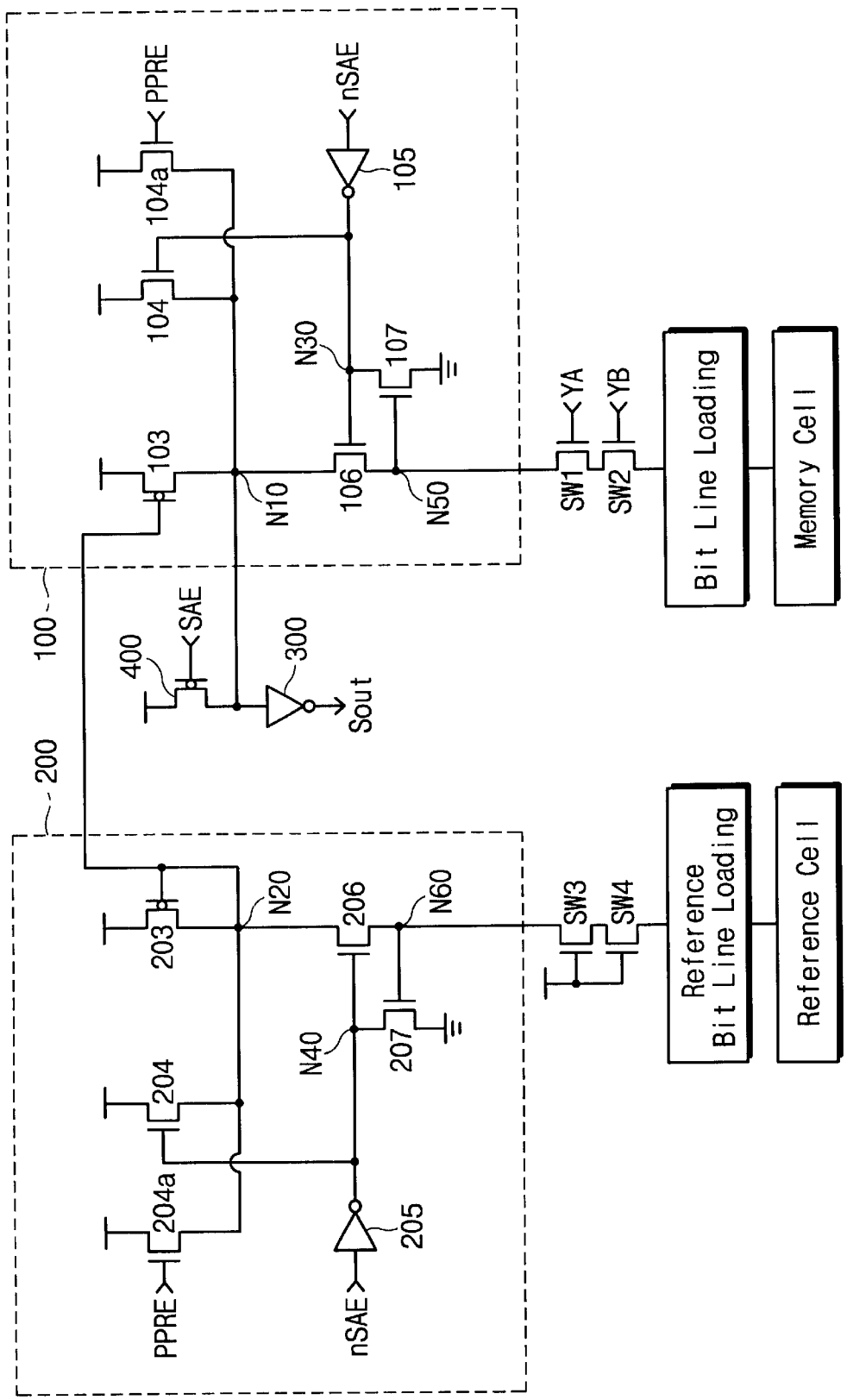
FIG. 4 is a third embodiment of a sense amplifier according to the present invention.

FIG. 4 illustrates a third embodiment of a sense amplifier according to the present invention. Referring to FIG. 4, the sense amplifier of the third embodiment has the same arrangement as that of the sense amplifier shown in FIG. 3 except that the transistors 101, 101a, 102, 108, 201, 201a, 202, and 208 are removed.

The differences of operation and effect between the sense amplifiers having discharge transistors and having no discharge transistors are as follows. The discharge transistors provide more stable precharge operation by fully discharging bit line and reference bit line before the precharge operation. Detailed explanation is omitted here for the sake of simplicity.

According to the sense amplifier structure of the present invention, using only a single inverter 300, instead of a differential amplifier, a power consumption can be decreased. In accordance with the conventional differential amplifier structure, a threshold voltage of an input transistor is increased because the input transistor is coupled in series with a transistor used as a current sinker. In order to turn on the input transistor, the power supply voltage is increased. This lowers the sensing speed of the conventional sense amplifier. As a result, the conventional sense amplifier is not ideal for a low power supply voltage application. On the other hand, the sense amplifier of the present invention is capable of operating at a low power supply voltage compared to the conventional sense amplifier using the differential amplifier.

Accordingly, the sense amplifier of the present invention is capable of securing a stable, speedy sensing operation even with the increased integration degree and a lower power supply voltage. As a consequence, sensing time can be reduced.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A sense amplifier comprising:

a reference voltage generator for producing a reference voltage at a reference node;

a sense voltage generating circuit coupled to a first bit line and to the reference node, on generating a sense voltage at a sense node in response to an on or off state of a memory cell and to the reference voltage;

a level detector coupled to the sense node, for detecting whether the sense voltage is higher than a predetermined trip voltage, and for outputting a logic low signal or a logic high signal representation of the on or off state of the memory cell, the level detector not being coupled to the reference node other than through the sense node, wherein the level detector comprises an inverter having the trip voltage; and a first switch coupled between a power supply voltage and the sense node, wherein the first switch is switched on/off in accordance with a first sense amplifier enable signal so as to supply the sense node with the power supply voltage.

2. The sense amplifier according to claim 1, further comprising a reference cell coupled to the reference voltage generator via a reference bit line.

3. The sense amplifier according to claim 2, wherein the reference voltage generator comprises:

a second switch coupled between the reference node and the reference bit line, and switched on/off in response to a bias voltage;

a bias circuit coupled to the reference bit line, for generating the bias voltage in response to a second sense amplifier enable signal, wherein the first and second sense amplifier enable signals are complementary to each other; and a current source coupled to the reference node, for sourcing current onto the reference node.

4. The sense amplifier according to claim 3, wherein the bias circuit comprises:

a second inverter having an input terminal receiving the second sense amplifier enable signal; and a first NMOS transistor having a drain coupled to an output terminal of the second inverter, a source grounded and a gate coupled to the reference bit line, wherein the bias voltage is generated from a bias node coupled in common to the output terminal of the second inverter and the drain of the first NMOS transistor.

5. The sense amplifier according to claim 4, wherein the current source comprises:
  a first PMOS transistor having a source coupled to the power supply voltage and a gate receiving a discharge signal;
  a second PMOS transistor having a source coupled to the power supply voltage and a gate receiving the discharge signal;
  a third PMOS transistor having a source coupled to a drain of the second PMOS transistor, and a drain and a gate which are coupled in common to the reference node; and
  a second NMOS transistor having a drain coupled to a drain of the first PMOS transistor, a source coupled to the reference node, and a gate coupled to the bias node.

6. The sense amplifier according to claim 2, wherein the sense voltage generator comprises:
  a second switch coupled between the sense node and a bit line, and switched on/off in response to a bias voltage;
  a bias circuit coupled to the bit line, for generating the bias voltage in response to a second sense amplifier enable signal, wherein the first and second sense amplifier enable signals are complementary to each other; and
  a current source coupled to the sense node and the reference node, for sourcing current onto the sense node.

7. The sense amplifier according to claim 6, wherein the bias circuit comprises:
  a second inverter having an input terminal receiving the second sense amplifier enable signal; and
  a first NMOS transistor having a drain coupled to an output terminal of the second inverter, a source grounded and a gate coupled to the bit line, wherein the bias voltage is generated from a bias node coupled in common to the output terminal of the second inverter and the drain of the first NMOS transistor.

8. The sense amplifier according to claim 7, wherein the current source comprises:
  a first PMOS transistor having a source coupled to the power supply voltage and a gate receiving a discharge signal;
  a second PMOS transistor having a source coupled to the power supply voltage and a gate receiving the discharge signal;
  a third PMOS transistor having a source coupled to a drain of the second PMOS transistor, a drain coupled to the sense node, and a gate coupled to the reference node so as to receive the reference voltage; and
  a second NMOS transistor having a drain coupled to a drain of the first PMOS transistor, a source coupled to the sense node, the second NMOS transistor having a gate coupled to the output terminal of the second inverter.

9. The sense amplifier according to claim 3, further comprising a first discharge transistor having a current path formed between the reference bit line and a ground voltage, and a gate receiving the discharge signal; and a second discharge transistor having a current path formed between the bit line and the ground voltage, and a gate receiving the discharge signal.

10. The sense amplifier according to claim 6, further comprising a first discharge transistor having a current path formed between the reference bit line and a ground voltage, and a gate receiving the discharge signal; and a second discharge transistor having a current path formed between the bit line and the ground voltage, and a gate receiving the discharge signal.

11. A semiconductor memory device comprising:
  a first bit line coupled to a memory cell;
  a second bit line coupled to a reference cell;
  a sense amplifier coupled to the first and second bit lines, wherein the sense amplifier includes:
    a reference voltage generating circuit coupled to the second bit line, for generating a reference voltage at a reference node,
    a sense voltage generating circuit coupled to the first bit line and the reference node, for generating a sense voltage at a sense node in response to an on or off state of the memory cell and to the reference voltage, and
    an inverter coupled to the sense node, for detecting whether the sense voltage is higher than a predetermined trip voltage, and for outputting a logic low signal or a logic high signal representation of the on or off state of the memory cell, the level detector not being coupled to the reference node other than through the sense node; and
  a PMOS transistor having a current path formed between a power supply voltage and the sense node, the PMOS transistor having a gate receiving a sense amplifier enable signal.

12. The semiconductor memory device according to claim 11, wherein the reference voltage generating circuit comprises:
  a first NMOS transistor having a current path coupled between the reference node and the reference bit line, the first NMOS transistor having a gate receiving a bias voltage;
  a bias circuit coupled to the reference bit line, for generating the bias voltage in response to a signal complementary to the sense amplifier enable signal; and
  a current source coupled to the reference node, for sourcing current onto the reference node.

13. The semiconductor memory device according to claim 12, wherein the bias circuit comprises a second inverter having an input terminal receiving the complementary signal of the sense amplifier enable signal; and a second NMOS transistor having a drain coupled to an output terminal of the second inverter, a source grounded and a gate coupled to the reference bit line; and
  wherein the current source comprises a second PMOS transistor having a source coupled to the power supply voltage and a gate receiving a discharge signal; a third PMOS transistor having a source coupled to the power supply voltage and a gate receiving the discharge signal; a fourth PMOS transistor having a source coupled to a drain of the third PMOS transistor, and a drain and a gate which are commonly coupled to the reference node; and a third NMOS transistor having a drain coupled to a drain of the second PMOS transistor, a source coupled to the reference node, and a gate coupled to the output terminal of the second inverter.

14. The semiconductor memory device according to claim 11, wherein the sense voltage generator comprises:
  a second NMOS transistor having a current path formed between the sense node and the first bit line and a gate receiving a bias voltage;
  a bias circuit coupled to the first bit line, for generating the bias voltage in response to a signal complementary to the sense amplifier enable signal; and a current source coupled to the reference node and the sense node, for sourcing current onto the sense node.

15. The semiconductor memory device according to claim 14, wherein the bias circuit comprises a second inverter having an input terminal receiving the complementary signal; and a second NMOS transistor having a drain coupled to an output terminal of the second inverter, a source grounded and a gate coupled to the first bit line; and wherein the current source comprises a second PMOS transistor having a source coupled to the power supply voltage and a gate receiving the discharge signal; a third PMOS transistor having a source coupled to the power supply voltage and a gate receiving the discharge signal; a fourth PMOS transistor having a source coupled to a drain of the third PMOS transistor, a drain coupled to the sense node, and a gate coupled to the reference node; and a third NMOS transistor having a drain coupled to a drain of the second PMOS transistor, a source coupled to the sense node, and a gate coupled to an output terminal of the second inverter.

16. A semiconductor memory device comprising:
a first bit line coupled to a memory cell;
a second bit line coupled to a reference cell;
a sense amplifier coupled to the first and second bit lines, wherein the sense amplifier comprises:
 a reference voltage generating circuit coupled to the second bit line, for generating a reference voltage at a reference node;
 a sense voltage generating circuit coupled to the first bit line and the reference node, for generating a sense voltage at a sense node in response to an on or off state of the memory cell and to the reference voltage;
 an inverter coupled to the sense node, for detecting whether the sense voltage is higher than a predetermined trip voltage, and for outputting a logic low signal or a logic high signal representation of the on or off state of the memory cell, the level detector not being coupled to the reference node other than through the sense node;
 a first discharge transistor having a current path formed between the first bit line and a ground voltage and a gate receiving a discharge signal; and
 a second discharge transistor having a current path formed between the second bit line and the ground voltage, the second discharge transistor having a gate receiving the discharge signal.

17. The semiconductor memory device according to claim 16, wherein the memory cell is comprised of one selected from the group consisting of a mask read-only memory cell and a flash memory cell.

18. A sense amplifier circuit for semiconductor memory devices, comprising:
a first bias circuit coupled to a reference bit line, for generating a first bias signal in response to a first sense amplifier enable signal;
a first current source for supplying precharge current to a reference node in response to the first bias signal and a precharge control signal;
a second bias circuit, coupled to a bit line, for generating a second bias signal in response to the first sense amplifier enable signal;
a second current source for supplying precharge current to a sense node in response to the second bias signal and the precharge control signal, the sense node having a sense voltage that depends on a voltage of the reference node; and a level detector coupled to the sense node, for detecting whether the voltage of the sense node is higher than a predetermined trip voltage, and for outputting a logic low or high signal representation of the on or off state of a memory cell, the level detector being coupled to the reference node only through the sense node.

19. The sense amplifier according to claim 18, wherein the level detector comprises an inverter having the trip voltage.

20. The sense amplifier according to claim 19, further comprising a switch coupled between a power supply voltage and the sense node, wherein the switch is switched on/off in accordance with a second sense amplifier enable signal so as to supply the sense node with the power supply voltage.

21. The sense amplifier according to claim 20, further comprising a reference cell coupled to the reference bit line.

22. The sense amplifier according to claim 21, further comprising:
a first MOS transistor having a source-drain path coupled between the reference bit line and the reference node, and a gate coupled to the first bias signal; and
a second MOS transistor having a source-drain path coupled between the bit line and the sense node, and a gate coupled to the second bias signal.

23. The sense amplifier according to claim 22, wherein the first bias circuit comprises an inverter having an input receiving the first sense amplifier enable signal and an output generating the first bias signal, and a third MOS transistor having a source-drain path coupled between a ground voltage and the first bias signal and a gate coupled to the reference bit line.

24. The sense amplifier according to claim 23, wherein the first current source comprises a fourth MOS transistor having a source-drain path coupled between the reference node and the power supply voltage and a gate coupled to the precharge control signal; a fifth MOS transistor having a source-drain path coupled between the reference node and the power supply voltage and a gate coupled to the first bias signal; and a mirror MOS transistor having a source coupled to the power supply voltage, and a gate and a drain which are coupled in common to the reference node.

25. The sense amplifier according to claim 23, wherein the second current source comprises a fourth MOS transistor having a source-drain path coupled between the sense node and the power supply voltage and a gate coupled to the precharge control signal; a fifth MOS transistor having a source-drain path coupled between the sense node and the power supply voltage and a gate coupled to the second bias signal; and a mirror MOS transistor having a source-drain path coupled between the power supply voltage and the sense node, and a gate coupled to the reference node.

26. The sense amplifier according to claim 24, wherein the precharge control signal is disabled before the fourth MOS transistor is shut off.

27. The sense amplifier according to claim 24, wherein the current driving capability of the fourth MOS transistor is larger than that of the fifth MOS transistor.

28. A sense amplifier circuit for semiconductor memory devices, comprising:
a first bias circuit, coupled to a reference bit line, for generating a first bias signal in response to a first sense amplifier enable signal;
a first current source for supplying precharge current to a reference node in response to the first bias signal, a precharge control signal and a discharge signal;
a second bias circuit, coupled to a bit line, for generating a second bias signal in response to the first sense amplifier enable signal;

a second current source for supplying precharge current to a sense node in response to the second bias signal, the precharge control signal and the discharge signal, the sense node having a sense voltage that depends on a voltage of the reference node;

a level detector coupled to the sense node, for detecting whether the voltage of the sense node is higher than a predetermined trip voltage, and for outputting a logic low or high signal representation of the on or off state of a memory cell, the level detector being coupled to the reference node only through the sense node;

a first MOS transistor having a source-drain path coupled between the reference bit line and the reference node, and a gate coupled to the first bias signal;

a second MOS transistor having a source-drain path coupled between the bit line and the sense node, and a gate coupled to the second bias signal;

a first discharge transistor, coupled to the reference bit line, for discharging the reference bit line in response to the discharge signal; and a second discharge transistor, coupled to the bit line, for discharging the bit line in response to the discharge signal.

29. The sense amplifier according to claim 28, wherein the level detector comprises an inverter having the predetermined trip voltage.

30. The sense amplifier according to claim 29, further comprising a switch coupled between a power supply voltage and the sense node, wherein the switch is switched on/off in accordance with a second sense amplifier enable signal so as to supply the sense node with the power supply voltage.

31. The sense amplifier according to claim 30, further comprising a reference cell coupled to the reference bit line.

32. The sense amplifier according to claim 31, wherein the first bias circuit comprises an inverter having an input receiving the first sense amplifier enable signal and an output generating the first bias signal, and a third MOS transistor having a source-drain path coupled between a ground voltage and the first bias signal and a gate coupled to the reference bit line.

33. The sense amplifier according to claim 32, wherein the first current source comprises:

a fourth MOS transistor having a source coupled to the reference node and a gate coupled to the precharge control signal;

a fifth MOS transistor having a source coupled to the reference node and a gate coupled to the first bias signal;

a mirror MOS transistor having a gate and a drain which are coupled in common to the reference node;

a sixth MOS transistor having a source coupled to the power supply voltage, a drain coupled to the drain of the fourth MOS transistor, and a gate coupled to the discharge signal;

a seventh MOS transistor having a source coupled to the power supply voltage, a drain coupled to the drain of the fifth MOS transistor, and a gate coupled to the discharge signal; and an eighth MOS transistor having a source coupled to the power supply voltage, a drain coupled to the source of the mirror MOS transistor, and a gate coupled to the discharge signal.

34. The sense amplifier according to claim 32, wherein the second current source comprises:

a fourth MOS transistor having a source coupled to the reference node and a gate coupled to the precharge control signal;

a fifth MOS transistor having a source coupled to the reference node and a gate coupled to the first bias signal;

a mirror MOS transistor having a drain coupled to the sense node and a gate coupled to the reference node;

a sixth MOS transistor having a source coupled to the power supply voltage, a drain coupled to the drain of the fourth MOS transistor, and a gate coupled to the discharge signal;

a seventh MOS transistor having a source coupled to the power supply voltage, a drain coupled to the drain of the fifth MOS transistor, and a gate coupled to the discharge signal; and an eighth MOS transistor having a source coupled to the power supply voltage, a drain coupled to the source of the mirror MOS transistor, and a gate coupled to the discharge signal.

35. The sense amplifier according to claim 33, wherein the precharge control signal is disabled before the fifth MOS transistor is shut off.

36. The sense amplifier according to claim 33, wherein the current driving capability of the fourth MOS transistor is larger than that of the fifth MOS transistor.

37. The sense amplifier according to claim 33, wherein the sixth to eighth MOS transistors are PMOS transistors.

* * * * *

UNITED STATES PATENT AND TRADEMARK OFFICE
CERTIFICATE OF CORRECTION

PATENT NO. : 6,362,661 B1
DATED : March 26, 2002
INVENTOR(S) : Jung-Hoon Park

It is certified that error appears in the above-identified patent and that said Letters Patent is hereby corrected as shown below:

Column 1,
Line 44, "utile" should read -- until -- .

Column 2,
Line 27, ".;" should read -- ; --.

Column 4,
Line 56, "has been" should read -- has --.

Column 6,
Line 26, "on generating" should read -- for generating --.

Signed and Sealed this

Twenty-ninth Day of July, 2003

JAMES E. ROGAN
*Director of the United States Patent and Trademark Office*